(12) United States Patent
Lien et al.

(10) Patent No.: US 6,256,216 B1
(45) Date of Patent: Jul. 3, 2001

(54) CAM ARRAY WITH MINIMUM CELL SIZE

(75) Inventors: Chuen-Der Lien, Los Altos Hills; Chau-Chin Wu, Cupertino, both of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/574,744

(22) Filed: May 18, 2000

(51) Int. Cl.[7] ................................................. G11C 15/00
(52) U.S. Cl. ................................................. 365/49; 365/204
(58) Field of Search ................................. 365/49, 203, 63, 365/72, 204

(56) References Cited

U.S. PATENT DOCUMENTS

| 4,780,845 | 10/1988 | Threewitt . |
| 5,051,948 | 9/1991 | Watabe et al. . |
| 5,111,427 | 5/1992 | Kobayashi et al. . |
| 5,319,589 | 6/1994 | Yamagata et al. . |
| 5,642,320 | 6/1997 | Jang . |
| 5,936,873 | 8/1999 | Kongetira ............................. 365/49 |
| 5,949,696 | 9/1999 | Treewitt ............................... 365/49 |
| 6,108,227 | 8/2000 | Voelkel ................................ 365/49 |

*Primary Examiner*—David Nelms
*Assistant Examiner*—Thong Le
(74) *Attorney, Agent, or Firm*—Bever, Hoffman & Harms, LLP

(57) ABSTRACT

A CAM array includes non-volatile ternary CAM cells that use access transistors to easily read from and write to the non-volatile transistors. Each ternary CAM cell includes a pair of storage elements that are used to store a data bit value, and an access element that is used during CAM array operation. During a comparison operation, when the applied data value matches the stored value, the storage elements de-couple the match line from a discharging bit line (i.e., a high voltage on the match line remains high). Conversely, when the applied data value does not match the stored value, the storage elements couple the match line to a discharging bit line, thereby discharging the match line.

12 Claims, 4 Drawing Sheets

Figure 3A

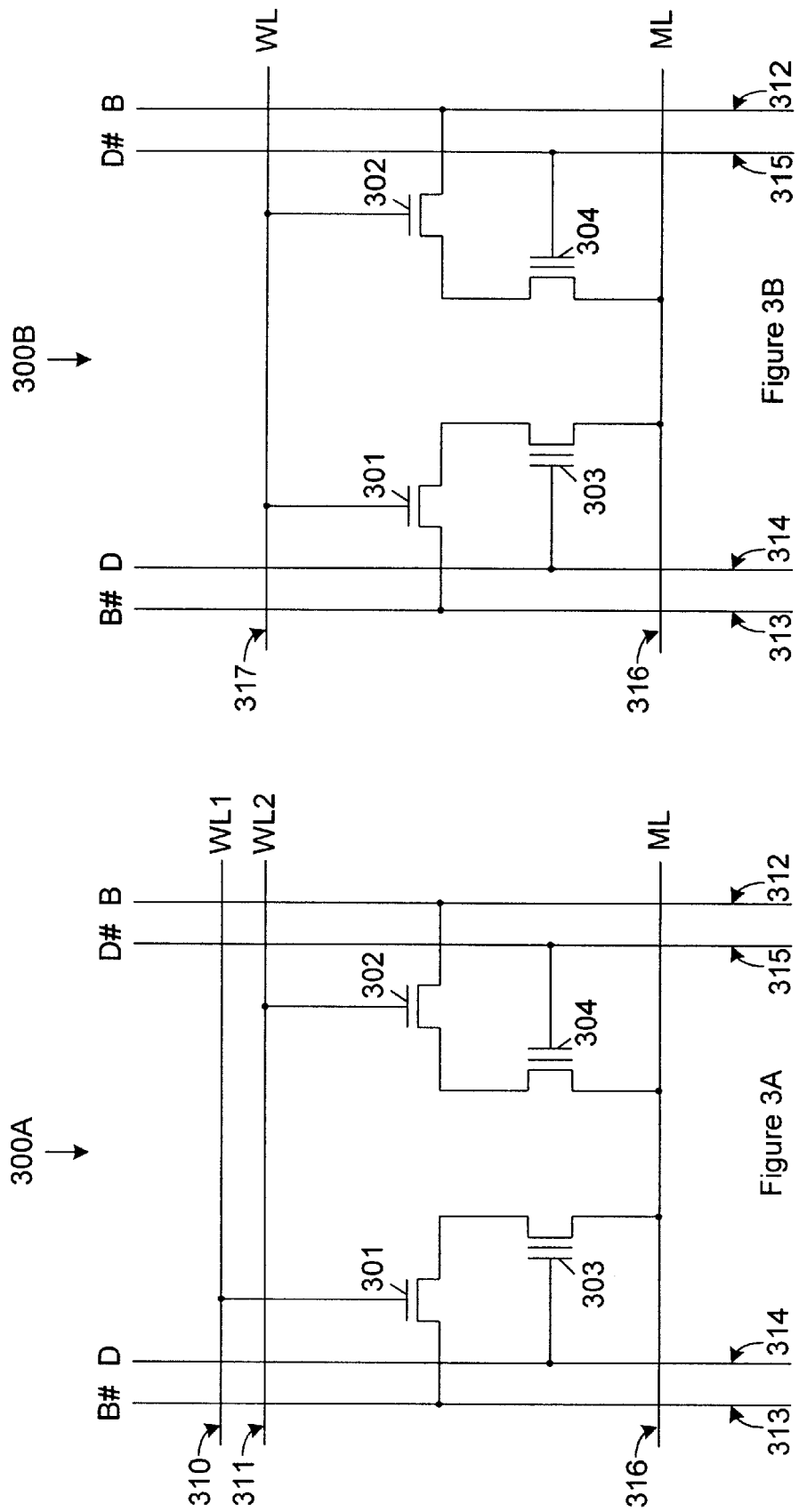

CAM ARRAY WITH MINIMUM CELL SIZE

FIELD OF THE INVENTION

The present invention relates to content addressable memory (CAM) arrays. More specifically, the present invention relates to ternary CAM cells and methods for operating these cells in a CAM array.

DISCUSSION OF RELATED ART

Unlike conventional random access memory (RAM) arrays, CAM arrays include memory cells that are addressed in response to their content, rather than by a physical address within a RAM array. That is, data words stored in a RAM array are accessed by applying address signals to the RAM array input terminals. In response to each unique set of address signals, a RAM array outputs a data value that is read from a portion of the RAM array designated by the address. In contrast, a CAM array receives a data value that is compared with all of the data values stored in rows of the CAM array. In response to each unique data value applied to the CAM array input terminals, the rows of CAM cells within the CAM array assert or de-assert associated match signals indicating whether or not one or more data values stored in the CAM cell rows match the applied data value.

CAM arrays are useful in many applications, such as search engines. For example, assume an employee list is searched to identify all employees with the first name "John". The first names are written into a CAM array such that they are stored in a predetermined order (e.g., according to employee number). The input data value ("John") is then applied to the CAM input terminals. When one or more stored data values match the input data value, the match line coupled to the one or more matching rows of CAM cells generates a high output signal. By identifying which rows have associated high match lines, and comparing those row numbers with the employee number list, all employees named "John" are identified. In contrast, to search a RAM array containing the same employee list, a series of addresses must be applied to the RAM array so that each stored data value is read out and compared with the "John" data value. Because each RAM read operation takes one clock cycle, a relatively large amount of time is required to read and compare a particular data value with all data values stored in a RAM array.

There are two types of CAM cells typically used in CAM arrays: binary CAM cells and ternary CAM cells. Binary CAM cells store one of two bit values: a logic high value or a logic low value. When the logic value stored in the binary CAM cell matches an applied data value, then the match line coupled to the binary CAM cell is maintained at a logic high value (assuming all other CAM cells coupled to the CAM array row also match), thereby indicating that a match has occurred. In contrast, when the logic value stored in the binary CAM cell does not match an applied data value, then the match line coupled to the binary CAM cell is pulled down, thereby indicating that a match has not occurred. Ternary CAM cells can store any one of three values: a logic high, a logic low, or a "don't care" value. When storing logic high and logic low values, a ternary CAM cell operates like a binary CAM cell. In addition, a ternary CAM cell storing a don't care value will provide a match condition for any data bit value applied to that CAM cell. This "don't care" capability allows CAM arrays to indicate when a data value matches a selected group of ternary CAM cells in a row of the CAM array. For example, assume each row of a ternary CAM array has eight ternary CAM cells. Additionally assume that the first four ternary CAM cells of each row each store one of a logic high and a logic low value (for comparison to the first four bits of an input 8-bit data value) and the last four ternary CAM cells of each row store "don't care" values. Under these conditions, when an 8-bit data value is applied to the ternary CAM array, a match occurs for each row of the CAM array in which the data values stored in the first four ternary CAM cells match the first four bits of the applied 8-bit data value.

FIG. 1 is a schematic diagram of a prior art non-volatile ternary CAM cell 100 as described in U.S. Pat. No. 5,051,948. CAM cell 100 includes the minimum number of elements (i.e., two) for a ternary CAM cell: non volatile (i.e., floating gate avalanche) transistors MF1–MF2. CAM cell 100 stores one of a logic high, a logic low, and a don't care value by selectively programming/erasing transistors MF1–MF2 during a write operation. During subsequent read operations, a data value (and its inverse data value) is applied to bit line BL (and inverted bit line BL#). Depending upon the programmed/erased state of transistors MF1–MF2, the word/match line WL/ML is either maintained in a charged state (indicating a match) or discharged to ground (indicating a no-match) in response to the data bit applied to bit line BL.

A problem with prior art CAM cell 100 is that the direct coupling of the gate of transistors MF1–MF2 to bit line BL and inverted bit line BL#, respectively, make it difficult to read from non-volatile transistors MF1–MF2. An array of CAM cells similar to CAM cell 100 share bit line BL and inverted bit line BL# in a column and share word line/match line WL/ML in columns. It is difficult to read this array because the gate of each transistor MF1 in a column of CAM cells coupled to bit line BL affects the voltage on bit line BL. Thus, a logic high voltage on bit line BL turns on all transistors MF1 having a low threshold voltage in the column. Similarly, the gate of each transistor MF2 in each column of CAM cells coupled to inverted bit line BL# affects the voltage on BL#. Thus, a logic high voltage on inverted bit line BL# turns on all transistors MF2 having a low threshold voltage in the column. As a result, it is difficult to isolate a particular CAM cell in a column of an array to read. It would therefore be desirable to have a ternary CAM cell that has a minimum number of transistors that may be easily read.

SUMMARY

Accordingly, the present invention provides a CAM array including non-volatile ternary CAM cells that use access transistors to easily read from the non-volatile transistors. These access transistors enable isolation of individual CAM cells in a column of an array during a read operation. As a result, the access transistors of the CAM cells in a column of an array uninvolved in the read operation are turned off, thereby isolating the CAM cell in the column to be read. Each ternary CAM cell includes a pair of storage elements that are used to store a data bit value and an access element that is used during CAM array operation. During a comparison operation, when the applied data value matches the stored value, the storage elements de-couple the match line from a discharging bit line (i.e., a high voltage on the match line remains high). Conversely, when the applied data value does not match the stored value, the storage elements couple the match line to a discharging bit line, thereby discharging the match line.

Voltage on the match line is sensed by a conventional voltage sensor. Therefore, a slight drop in the voltage of the match line will register as a no-match condition. By sensing the slight voltage changes on the match line, the match line does not need to be completely discharged to determine the match/no-match condition of a CAM cell. Therefore, the power and time required to recharge the slightly discharged match line is less than that required to recharge a fully discharged match line.

The present invention will be more fully understood in view of the following description and drawings.

BRIEF DESCRIPTION OF THE DRAWINGS

FIG. 3A is a schematic diagram of a ternary CAM cell in accordance with a first embodiment of the present invention;

FIG. 3B is a schematic diagram of a ternary CAM cell in accordance with a variation of the embodiment of FIG. 3A.

DETAILED DESCRIPTION

Figure 1:
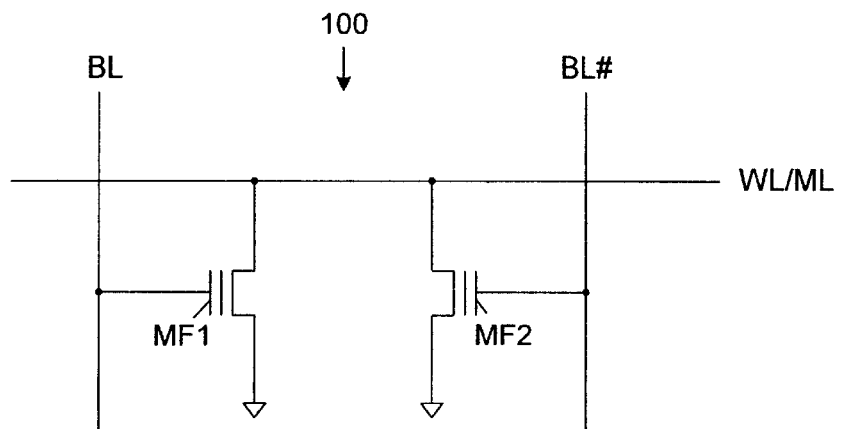
FIG. 1 is a schematic diagram of a prior art ternary CAM cell.
Figure 2A:
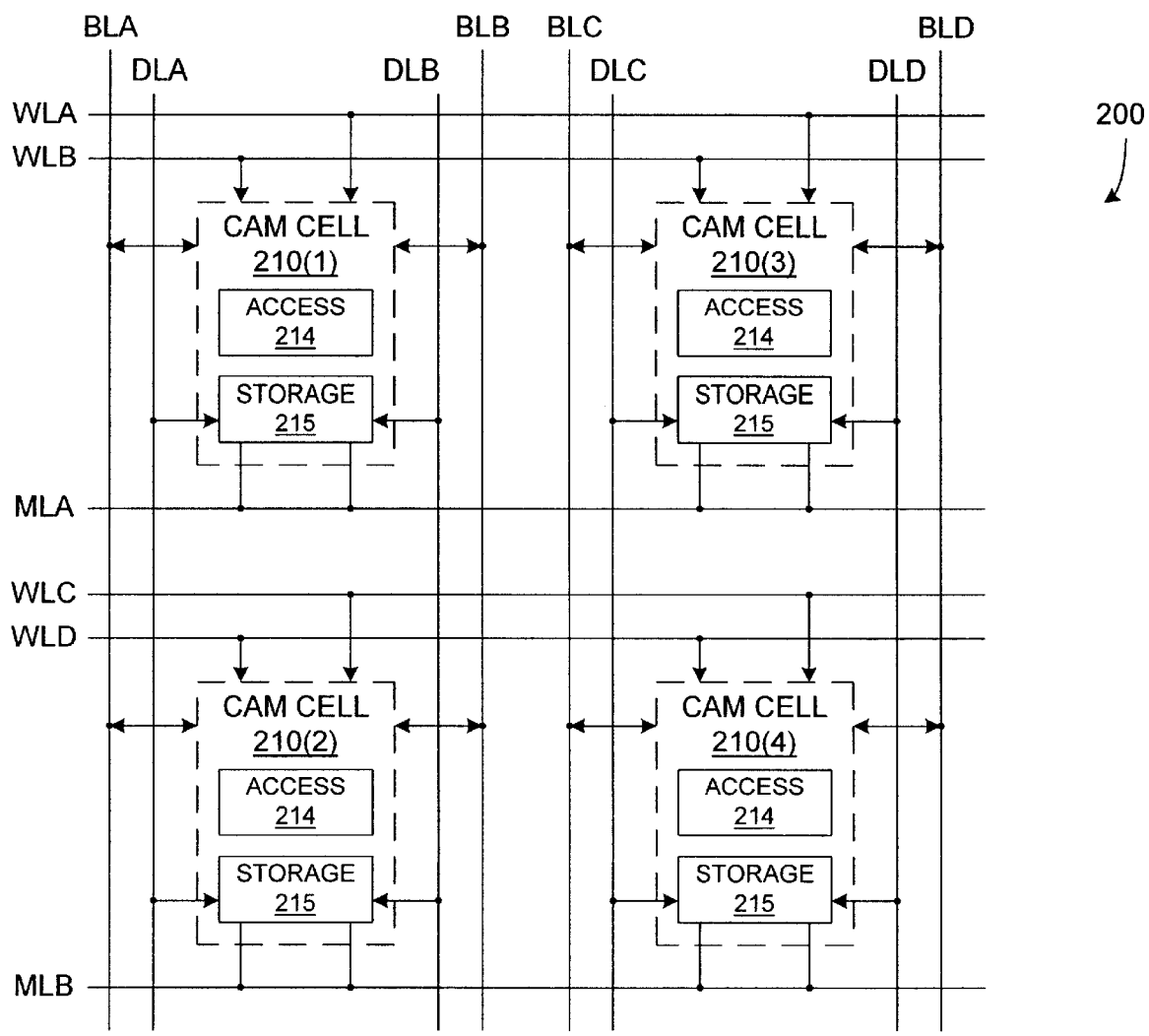
FIG. 2A is a schematic diagram of a ternary CAM array in accordance with an embodiment of the present invention.

FIG. 2A is a simplified schematic diagram showing a portion of a CAM array 200. CAM array 200 includes CAM cells 210(1) through 210(1) that are coupled to bit lines BLA–BLD, word lines WLA–WLD, data lines DLA–DLD, and match lines MLA–MLB.

Figure 2B:
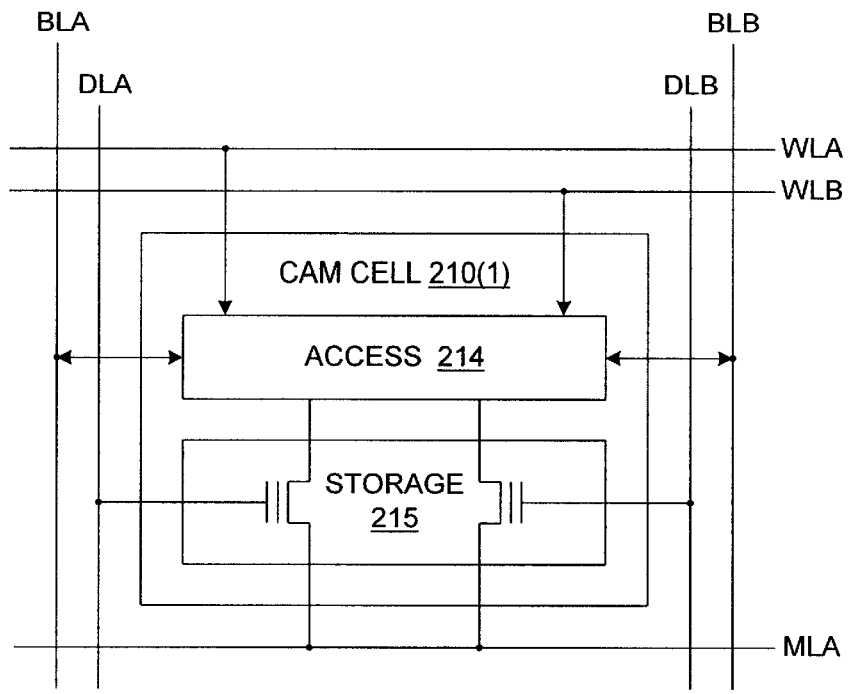
FIG. 2B is a schematic diagram of a ternary CAM cell in accordance with the CAM array of FIG. 2A.

Similar to prior art CAM cell 100 (discussed above), each of CAM cells 200(1) through 200(1) includes a storage element 215, each storage element having two non-volatile transistors for storing a data value that are coupled to two of data lines DLA-DLD and to one of match lines MLA22 B. In addition, each of CAM cells 200(1) through 200(1) includes an access element 214 that is coupled between storage element 215 and two of bit lines BLA–BLD as well as two of word lines WLA–WLD. FIG. 2B shows CAM cell 210(1) in more detail.

Figure 2C:
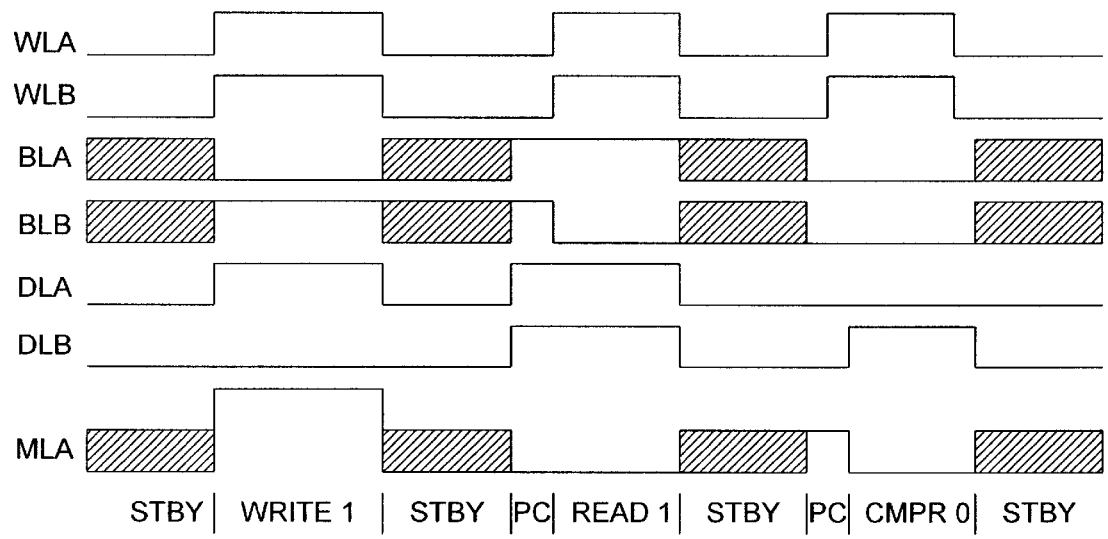
FIG. 2C is a timing diagram in accordance with the CAM cell of FIG. 2B.

FIG. 2C is a timing diagram that shows signal (voltage) levels on the various lines of CAM cell 210(1) for a particular embodiment of the present invention (e.g., FIG. 3A described below) during standby (STBY), write (WRITE), read (READ including a pre-charge operation, PC) and comparison (CMPR including a pre-charge operation, PC) operations. Shaded values in the timing diagram indicate a "don't care" state where a specific voltage level is not required and therefore the last voltage level of the line is typically maintained. The operation of an individual CAM cell in CAM array 200 will now be described with reference to FIGS. 2A and 2C. In a standby state, for example, of CAM cell 210(1), word lines WLA–WLB are pulled down to logic low values, thereby turning off CAM cell 210(1). The data lines DLA–DLB are held to logic low values. Match line MLA may be left floating to save power. Bit lines BLA–BLB are preferably left in their last state.

A data value (e.g., a logic high value) is written to CAM cell 210(1) by pulling up word lines WLA–WLB and applying the data value (i.e., a logic high value) on bit line BLB and the inverted data value (i.e., a logic low value) on bit line BLA. Data lines DLA and DLB are held to the same values as BLB and BLA, respectively. Match line MLA is held to approximately twice the value of the $V_{vcc}$ voltage supply source. Therefore, for $V_{vcc}$ voltage supply source value of 3.3 Volts, match line MLA is held to a value of 6.6 Volts.

Some time after CAM cell 210(1) returns to a standby state, a read operation is performed in which the stored data value is read. Bit line BLA and inverted bit line BLB are pre-charged to logic high values and then word lines WLA–WLB are brought to logic high values. Data lines DLA–DLB are held to logic high values and match line MLA is held to a logic low value. The logic high value stored in CAM cell 210(1) causes bit line BLA to remain at a logic high value, but discharges bit line BLB to a logic low value. The data stored in CAM cell 210(1) is read from bit lines BLA–BLB.

Some time after CAM cell 210(1) returns to a standby condition, a comparison operation is performed in which the stored data value is compared with an applied data value (e.g., a logic low value) transmitted on data lines DLA–DLB. Word lines WLA–WLB are held to logic high values and bit lines BLA–BLB are held to logic low values. Match line MLA is pre-charged to a logic high value. If the received data value matches the stored data value, match line MLA remains de-coupled from bit lines BLA–BLB. However, if the received data value does not match the stored data value, match line MLA is coupled to one of bit lines BLA–BLB, thereby discharging match line MLA (i.e., pulling down match line MLA to a low voltage level).

With the operation of each CAM cell 210(1) through 210(4) established, the operation of CAM array 200 will now be explained. Namely, data words transmitted on bit lines BLA–BLD are stored in the rows of CAM cells, and compared with data words transmitted on data lines DLA–DLB For example, a first two-bit data word is stored in CAM cells 200(1) and 200(3), and a second two-bit data word is stored in CAM cells 200(1) and 200(1). A "match" data word is simultaneously compared with both stored data words by transmitting the "match" data word on data lines DLA and DLC and the inverse of the "match" data word on data lines DLB and DLD. If each bit of the "match" data word is equal to the data bits stored in CAM cells 200(1) and 200(3), then match line MLA is maintained at a logic high level, thereby indicating a match. Conversely, if one or more bits of the "match" data word differ from those stored in CAM cells 200(1) and 200(3), then match line MLA is discharged to one of bit lines BLA–BLD, thereby reducing the voltage on match line MLA.

CAM cells 200(1) through 200(1) are described in additional detail below with reference to various embodiments the incorporate the novel aspects of the present invention.

FIRST EMBODIMENT

4T Non-volatile CAM Cell

FIG. 3A is a schematic diagram of a novel four-transistor non-volatile ternary CAM cell 300A in accordance with an embodiment of the present invention. Ternary CAM cell 300A includes n-channel transistors 301–302 and non-volatile transistors 303–304. Transistors 301–302 have first terminals coupled to the first terminals (e.g., drains) of transistors 303–304, respectively. Word lines 310–311 are coupled to the gates of transistors 301–302, respectively. An inverted bit line 313 is coupled to a second terminal of transistor 301. A bit line 312 is coupled to a second terminal of transistor 302. A data line 314 is coupled to a gate of transistor 303. An inverted data line 315 is coupled to a gate of transistor 304. A match line 316 is commonly coupled to the second terminals (e.g., sources) of transistors 303–304.

The operation of ternary CAM cell 300A will now be described. During normal operation, CAM cell 300A is placed in various conditions, including standby, write, read, and compare. A standby condition exists when CAM cell 300A is not undergoing a read, write, or comparison operation. During a standby condition in CAM cell 300A, word lines 310–311 are held to logic low values, thereby turning off transistors 301–302. Data line 314 and inverted data line 315 are held to logic low values. Bit line 312, inverted bit line 313, and match line 316 can have any value, but are preferably held to their previous logic values. Match line 316 may also be left floating to save power.

A write operation for CAM cell 300A is performed as follows. Word lines 310–311 are held to logic high values. The data to be written to CAM cell 300A are provided on bit line 312 and inverted bit line 313. Data line 314 and inverted data line 315 are held to same values as bit line 312 and inverted bit line 313, respectively. Match line 316 is held to a voltage equivalent to approximately twice the $V_{cc}$ voltage supply source (e.g., 3.3 Volts). As a result, match line 316 applies a voltage of approximately 6.6 Volts to the sources of transistors 303–304.

CAM cell 300A stores one of three values: a logic high value, a logic low value, and a "don't care" logic value. To store a logic low value in CAM cell 300A, a logic low value is applied to bit line 312 and a logic high value is applied to inverted bit line 313. The logic high value of word line 310 turns on transistor 301, thereby applying the logic high value of inverted bit line 313 to the drain of transistor 303. The logic high value of word line 311 turns on transistor 302, thereby applying the logic low value of bit line 312 to the drain of transistor 304. The logic low value of data line 314 turns off transistor 303, thereby preventing current flow from the source to the drain of transistor 303. As a result, the threshold voltage of transistor 303 remains a low threshold voltage. The logic high value of inverted data line 315 turns on transistor 304, thereby allowing current to flow from the source to the drain of transistor 304. This current flow allows some electrons to be injected into the floating gate of transistor 304. As a result, the threshold voltage of transistor 304 raises to a high threshold voltage.

To store a logic high value in CAM cell 300A, a logic high value is applied to bit line 312 and a logic low value is applied to inverted bit line 313. The logic high value of word line 310 turns on transistor 301, thereby applying the logic low value of inverted bit line 313 to the drain of transistor 303. The logic high value of word line 311 turns on transistor 302, thereby applying the logic high value of bit line 312 to the drain of transistor 304. The logic high value of data line 314 turns on transistor 303, thereby allowing current to flow from the source to the drain of transistor 303. This current flow allows some electrons to be injected into the floating gate of transistor 303. As a result, the threshold voltage of transistor 303 raises to a high threshold voltage. The logic low value of inverted data line 315 turns off transistor 304, thereby preventing current flow from the source to the drain of transistor 304. As a result, the threshold voltage of transistor 304 remains a low threshold voltage.

To store a "don't care" logic value, logic low values are applied to bit line 312 and inverted bit line 313 and logic high values are applied to data line 314 and inverted data line 315. The logic high value of word lines 310–311 turn on transistors 301–302, thereby applying the logic low values of inverted bit line 313 and bit line 312 to the drains of transistor 303–304, respectively. The logic high values of data line 314 and inverted data line 315 turn on transistor 303–304, respectively, thereby allowing current to flow from their sources to their drains. This current flow allows some electrons to be injected into the floating gates of transistors 303–304. As a result, the threshold voltage of transistors 303–304 raise to a high threshold voltage.

A read operation for CAM cell 300A is performed as follows. Word lines 310–311, data line 314, and inverted data line 315 are held to logic high values. Bit line 312 and inverted bit line 313 are pre-charged to logic high values. Match line 316 is held to a logic low value.

The logic high value of word line 310 turns on transistor 301, thereby coupling the pre-charged value of inverted bit line 313 to the drain of transistor 303. As a result, if transistor 303 has a low threshold voltage, then the logic high value of data line 314 turns on transistor 303, thereby discharging inverted bit line 313 to match line 316. If transistor 303 has a high threshold voltage, the logic value of inverted bit line 313 remains a logic high value. Similarly, the logic high value of word line 311 turns on transistor 302, thereby coupling the pre-charged value of bit line 312 to the drain of transistor 304. As a result, if transistor 304 has a low threshold voltage, then the logic high value of inverted data line 315 turns on transistor 304, thereby discharging bit line 312 to match line 316. If transistor 304 has a high threshold voltage, the logic value of bit line 312 remains a logic high value. Data is read from bit line 312 and inverted bit line 313.

A compare operation for CAM cell 300A is performed as follows. Match line 316 is pre-charged to a logic high value. Bit line 312 and inverted bit line 313 are held to logic low values. Data to be compared is provided on data line 314 and inverted data line 315. Word lines 310–311 are held to logic high values. The logic high values of word lines 310–311 turn on transistors 301–302, respectively, thereby coupling bit line 312 and inverted bit line 313 to the drains of transistors 303–304, respectively.

If CAM cell 300A stores a logic low value, then transistor 303 has a low threshold voltage and transistor 304 has a high threshold voltage, as described above. If a logic low value is compared to CAM cell 300A, then the logic high value applied to data line 314 fails to turn on transistor 303 and the logic high value applied to inverted data line 315 fails to turn on transistor 304. As a result, match line 316 remains at the pre-charged value, thereby indicating a match condition. However, if a logic high value is compared to CAM cell 300A, then the logic high value applied to data line 314 turns on transistor 303, thereby discharging match line 316 to inverted bit line 313 through turned on transistor 301. The discharge of match line 316 is interpreted as a no22 match condition.

If CAM cell 300A stores a logic high value, then transistor 303 has a high threshold voltage and transistor 304 has a low threshold voltage, as described above. If a logic low value is compared to CAM cell 300A, then the logic high value applied to inverted data line 315 turns on transistor 304, thereby discharging match line 316 to bit line 312 through turned on transistor 302. The discharge of match line 316 is interpreted as a no-match condition. However, if a logic high value is compared to CAM cell 300A, then the logic high value applied to data line 314 is unable to turn on transistor 303 and the logic low value applied to inverted data line 315 is unable to turn on transistor 304. As a result, match line 316 remains at the pre-charged logic value, thereby indicating a match condition.

If CAM cell 300A stores a "don't care" logic value, then transistors 303–304 have high threshold voltages. As a result, no data value applied to data line 314 and inverted data line 315 turns on transistors 303–304. Therefore, there is no discharge path for match line 316. As a result, match line 316 remains at a pre-charged logic value, thereby indicating a match condition for all applied data values.

FIG. 3B is a schematic diagram of a ternary CAM cell 300B in accordance with a variation of the embodiment of FIG. 3A in which word lines 310–311 of FIG. 3A are co-formed, thereby resulting in a single word line 317. Therefore, the cell size of CAM cell 300B is smaller than the cell size of CAM cell 300A. Similar elements between FIGS. 3A and 3B are labeled similarly. CAM cell 300B operates similarly to CAM cell 300A.

SECOND EMBODIMENDT

3T Non-volatile CAM Cell

Figure 4:
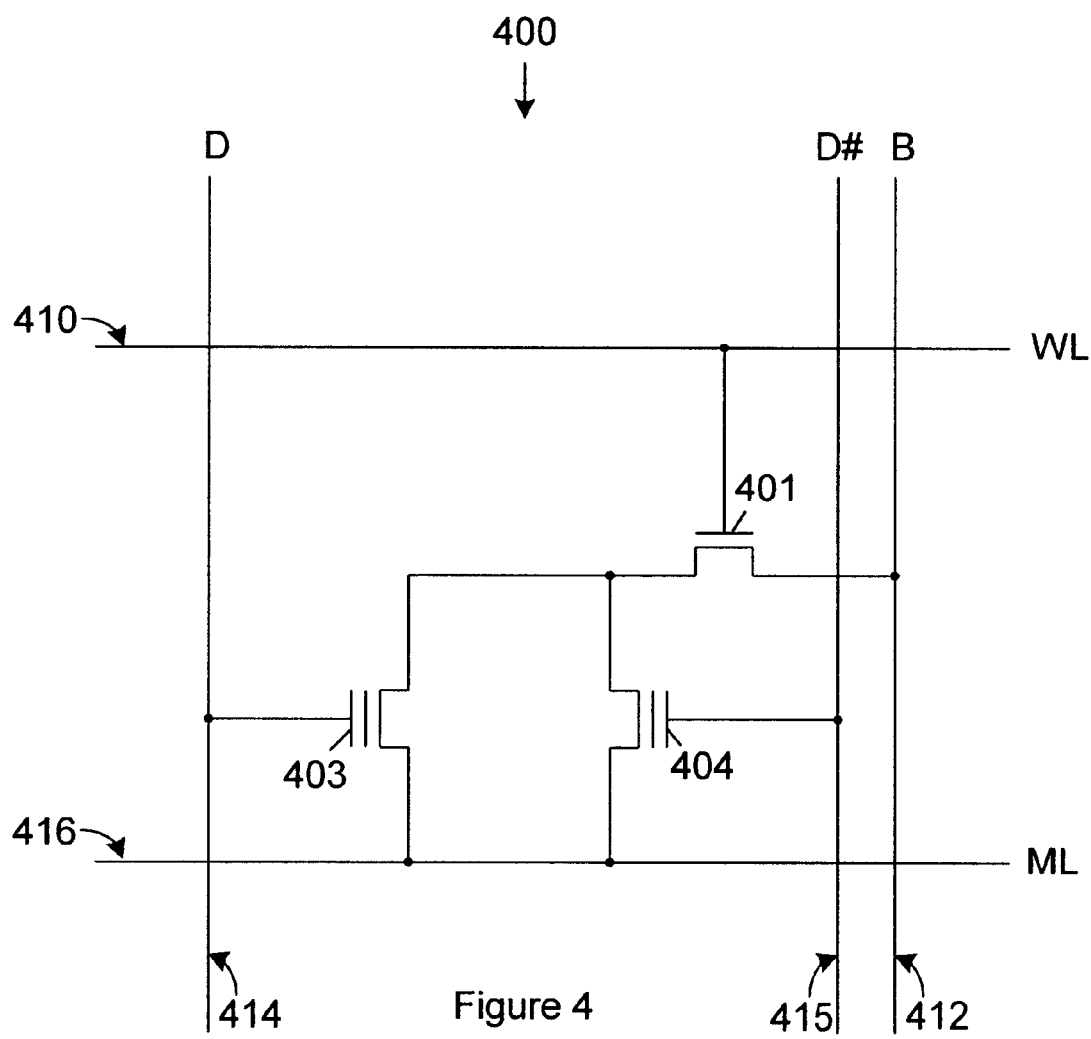
FIG. 4 is a schematic diagram of a ternary CAM cell in accordance with a third embodiment of the present invention.

FIG. 4 is a schematic diagram of a novel three-transistor non-volatile ternary CAM cell 400 in accordance with another embodiment of the present invention. Ternary CAM cell 400 includes n-channel transistor 401 and non-volatile transistors 403–404. Transistor 401 has a first terminal coupled to the first terminals (e.g., drains) of transistors 403–404, respectively. Word line 410 is coupled to the gate of transistor 401. A bit line 412 is coupled to a second terminal of transistor 401. A data line 414 is coupled to a gate of transistor 403. An inverted data line 415 is coupled to a gate of transistor 404. A match line 416 is commonly coupled to the second terminals (e.g., sources) of transistors 403–404.

The operation of ternary CAM cell 400 will now be described. During normal operation, CAM cell 400 is placed in various conditions, including standby, write, read, and compare. A standby condition exists when CAM cell 400 is not undergoing a read, write, or comparison operation. During a standby condition in CAM cell 400, word line 410 is held to a logic low value, thereby turning off transistor 401. Data line 414, inverted data line 415, bit line 412, and match line 416 can have any value, but are preferably held to their previous logic values.

A write operation for CAM cell 400 is performed as follows. Word line 410 is held to a logic high value. The data to be written to CAM cell 400 are provided on data line 414 and inverted data line 415. Bit line 412 is held to a logic low value. Match line 416 is held to a voltage equivalent to approximately twice the $V_{vcc}$ voltage supply source (e.g., 3.3 Volts). As a result, match line 416 applies a voltage of approximately 6.6 Volts to the sources of transistors 403–404.

CAM cell 400 stores one of three values: a logic high value, a logic low value, and a "don't care" logic value. To store a logic low value in CAM cell 400, a logic low value is applied to data line 414 and a logic high value is applied to inverted data line 415. The logic high value of word line 410 turns on transistor 401, thereby applying the logic low value of bit line 412 to the drains of transistors 403–404. The logic low value of data line 414 turns off transistor 403, thereby preventing current flow from the source to the drain of transistor 403. As a result, the threshold voltage of transistor 403 remains a low threshold voltage. The logic high value of inverted data line 415 turns on transistor 404, thereby allowing current to flow from the source to the drain of transistor 404. This current flow allows some electrons to be injected into the floating gate of transistor 404. As a result, the threshold voltage of transistor 404 raises to a high threshold voltage.

To store a logic high value in CAM cell 400, a logic high value is applied to data line 414 and a logic low value is applied to inverted data line 415. The logic high value of word line 410 turns on transistor 401, thereby applying the logic low value of bit line 412 to the drains of transistors 403–404. The logic high value of data line 414 turns on transistor 403, thereby allowing current to flow from the source to the drain of transistor 403. This current flow allows some electrons to be injected into the floating gate of transistor 403. As a result, the threshold voltage of transistor 403 raises to a high threshold voltage. The logic low value of inverted data line 415 turns off transistor 404, thereby preventing current flow from the source to the drain of transistor 404. As a result, the threshold voltage of transistor 404 remains a low threshold voltage.

To store a "don't care" logic value, a logic low value is applied to bit line 412 and logic high values are applied to data line 414 and inverted data line 415. The logic high value of word line 410 turns on transistor 401, thereby applying the logic low value of bit line 412 to the drains of transistor 403–404. The logic high values of data line 414 and inverted data line 415 turn on transistor 403–404, respectively, thereby allowing current to flow from their sources to their drains. This current flow allows some electrons to be injected into the floating gates of transistors 403–404. As a result, the threshold voltage of transistors 403–404 raise to a high threshold voltage.

A read operation for CAM cell 400 is performed as follows. First the left non-volatile transistor 403 is read and then the right non-volatile transistor 404 is read. Word line 410 is held to a logic high value. Bit line 412 is pre-charged to a logic high value. Match line 416 is held to a logic low value.

To read transistor 403, data line 414 is held to a logic high value and inverted data line 415 is held to a logic low value. If transistor 403 has a low threshold voltage, then the logic high value of data line 414 turns on transistor 403, thereby allowing bit line 412 to discharge to match line 416. However, if transistor 403 has a high threshold voltage, then transistor 403 does not turn on, thereby maintaining bit line 412 at a logic high value.

To read transistor 404, data line 414 is held to a logic low value and inverted data line 415 is held to a logic high value. If transistor 404 has a low threshold voltage, then the logic high value of inverted data line 415 turns on transistor 404, thereby allowing bit line 412 to discharge to match line 416. However, if transistor 404 has a high threshold voltage, then transistor 404 does not turn on, thereby maintaining bit line 412 at a logic high value.

A compare operation for CAM cell 400 is performed as follows. Match line 416 is pre-charged to a logic high value. Bit line 412 is held to a logic low value. Data to be compared is provided on data line 414 and inverted data line 415. Word line 410 is held to a logic high value. The logic high value of word line 410 turns on transistor 401, thereby coupling bit line 412 to the drains of transistors 403–404.

If CAM cell 400 stores a logic low value, then transistor 403 has a low threshold voltage and transistor 404 has a high threshold voltage, as described above. If a logic low value is compared to CAM cell 400, then the logic high value applied to data line 414 fails to turn on transistor 403 and the logic high value applied to inverted data line 415 fails to turn on transistor 404. As a result, match line 416 remains at the pre-charged value, thereby indicating a match condition. However, if a logic high value is compared to CAM cell 400, then the logic high value applied to data line 414 turns on transistor 403, thereby discharging match line 416 to bit line 412 through turned on transistor 401. The discharge of match line 416 is interpreted as a no-match condition.

If CAM cell 400 stores a logic high value, then transistor 403 has a high threshold voltage and transistor 404 has a low threshold voltage, as described above. If a logic low value is compared to CAM cell 400, then the logic high value applied to inverted data line 415 turns on transistor 404, thereby discharging match line 416 to bit line 412 through turned on transistor 401. The discharge of match line 416 is interpreted as a no-match condition. However, if a logic high value is compared to CAM cell 400, then the logic high value applied to data line 414 is unable to turn on transistor 403 and the logic low value applied to inverted data line 415 is unable to turn on transistor 404. As a result, match line 416 remains at the pre-charged logic value, thereby indicating a match condition.

If CAM cell 400 stores a "don't care" logic value, then transistors 403–404 have high threshold voltages. As a result, no data value applied to data line 414 and inverted data line 415 turns on transistors 403–404. Therefore, there is no discharge path for match line 416. As a result, match line 416 remains at a pre-charged logic value, thereby indicating a match condition for all applied data values.

Although the invention has been described in connection with a number of described embodiments, it is understood that this invention is not limited to the embodiments disclosed, but is capable of various modifications which would be apparent to a person skilled in the art. Thus, the invention is limited only by the following claims.

We claim:

1. A content-addressable memory (CAM) array comprising:
   a first bit line;
   a first word line;
   a match line;
   a first data line; and
   a content-addressable memory (CAM) cell coupled to the first bit line and the first word line, the CAM cell including:
      a storage circuit coupled to the first data line and the match line for storing a first data value during a write operation, and
      an access circuit coupled between the storage circuit and the first bit line, wherein during a comparison operation, the access circuit is controlled by an input data value transmitted on the first word line to form a discharge path between the match line and the first bit line when the first data value is different from the input data value.

2. The CAM array of claim 1, wherein the first bit line and the first data line are co-formed as a single bit/data line.

3. The CAM array of claim 1, further comprising:
   a second bit line coupled to the CAM cell;
   a second word line coupled to the CAM cell; and
   a second data line coupled to the storage circuit.

4. The storage circuit of claim 3 including:
   a first non-volatile memory cell having a gate coupled to the first data line, a first terminal coupled to the access circuit, and a second terminal coupled to the match line; and
   a second non-volatile memory cell having a gate coupled to the second data line, a first terminal coupled to the access circuit, and a second terminal coupled to the match line.

5. A content-addressable memory (CAM) array comprising:
   a first bit line;
   a first word line;
   a match line; and
   a content-addressable memory (CAM) cell coupled to the first bit line and the first word line, the CAM cell including:
      a storage circuit coupled to the first bit line and the match line for storing a first data value during a write operation, and
      an access circuit coupled between the storage circuit and the first bit line, wherein during a comparison operation, the access circuit is controlled by an input data value transmitted on the first word line to form a discharge path between the match line and the first bit line when the first data value is different from the input data value.

6. An integrated circuit including a bit line, a word line, a match line, and a content-addressable memory (CAM) cell, the CAM cell comprising:
   a volatile transistor having a first terminal coupled to the bit line, a second terminal, and a gate terminal coupled to the word line; and
   a non-volatile transistor having a first terminal coupled to the match line, a second terminal coupled to the second terminal of the volatile transistor, and a gate terminal coupled to the bit line;
   wherein the non-volatile transistor is turned on to shunt the match line to the bit line when the word line is and a value applied to the bit line is different than a value stored in the non-volatile transistor.

7. An integrated circuit (IC) including a first bit line, a first data line, a first word line, a match line, and a content-addressable memory (CAM) cell, the CAM cell comprising:
   a first volatile transistor having a first terminal coupled to the first bit line, a second terminal, and a gate terminal coupled to the first word line; and
   a first non-volatile transistor having a first terminal coupled to the match line, a second terminal coupled to the second terminal of the first volatile transistor, and a gate terminal coupled to the first data line;
   wherein the first non-volatile transistor is turned on to shunt the match line to the first bit line when a value applied to the first data line is different than a value stored in the first non-volatile transistor.

8. The IC of claim 7, further including a second bit line, a second data line, a second word line, the CAM cell further comprising:
   a second volatile transistor having a first terminal coupled to the second bit line, a second terminal, and a gate terminal coupled to the second word line; and
   a first non-volatile transistor having a first terminal coupled to the match line, a second terminal coupled to the second terminal of the first volatile transistor, and a gate terminal coupled to the second data line.

9. The IC of claim 8, wherein the first bit line and the first data line are co-formed as a single first bit/data line.

10. The IC of claim 9, wherein the second bit line and the second data line are co-formed as a single second bit/data line.

11. The IC of claim 8, wherein the first word line and the second word line are co-formed as a single word line.

12. The IC of claim 7, further including a second data line, the CAM cell further comprising:

a second non-volatile transistor having a first terminal coupled to the match line, a second terminal the second terminal of the first volatile transistor, and a gate coupled to the second data line.

* * * * *